United States Patent
Terada et al.

(10) Patent No.: US 7,158,387 B2
(45) Date of Patent: Jan. 2, 2007

(54) FILM CARRIER TAPE FOR MOUNTING ELECTRONIC PART

(75) Inventors: Akihiro Terada, Shimonoseki (JP); Keisuke Yamashita, Shimonoseki (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 289 days.

(21) Appl. No.: 10/664,119

(22) Filed: Sep. 17, 2003

(65) Prior Publication Data
US 2004/0066635 A1    Apr. 8, 2004

(30) Foreign Application Priority Data
Sep. 18, 2002    (JP)    ............................. 2002-271864

(51) Int. Cl.
    *H05K 1/11* (2006.01)
    *H05K 1/14* (2006.01)
(52) U.S. Cl. ....................... 361/784; 361/767; 361/774
(58) Field of Classification Search ........ 174/254–258; 361/792–795; 257/700–704, 770–778; 228/103–108; 428/209–210; 29/840, 854
See application file for complete search history.

(56) References Cited

U.S. PATENT DOCUMENTS

| 6,268,645 B1 * | 7/2001 | Takenaka et al. ............ 257/668 |
| 6,559,524 B1 * | 5/2003 | Seko ............................ 257/673 |
| 6,570,259 B1 * | 5/2003 | Alcoe et al. ................. 257/778 |
| 6,657,697 B1 * | 12/2003 | Yamate et al. .............. 349/151 |

* cited by examiner

*Primary Examiner*—Tuan Dinh
(74) *Attorney, Agent, or Firm*—The Webb Law Firm

(57) ABSTRACT

A film carrier tape for mounting electronic part comprises an insulating film, a wiring pattern formed on a surface of the insulating film, and a solder resist layer formed by moving a squeegee using a screen mask of a prescribed pattern that is formed in such a manner that connecting terminal portions of the wiring pattern should be exposed. The edge of the solder resist layer is formed almost in parallel or almost at right angles to the moving direction of the squeegee used in the application of the solder resist. The solder resist layer can be formed by the use of a screen mask for solder resist coating in which the edge of the screen that is unmasked to apply the solder resist is formed almost in parallel or almost at right angles to the moving direction of the squeegee used in the application of the solder resist. According to the present invention, the fraction defective of the solder resist coating can be decreased.

1 Claim, 7 Drawing Sheets

PRIOR ART

FILM CARRIER TAPE FOR MOUNTING ELECTRONIC PART

FIELD OF THE INVENTION

The present invention relates to film carrier tapes for mounting electronic parts less suffering protrusion of solder resist at the edge of the solder resist layer.

The invention, also relates to screen masks for producing such film carrier tapes.

BACKGROUND OF THE INVENTION

For mounting electronic parts such as integrated circuits (IC), film carrier tapes for mounting electronic part having a wiring pattern on an insulating film are employed. The film carrier tapes for mounting electronic part are generally produced by a process comprising bonding a metal foil such as a copper foil to a surface of an insulating film such as a polyimide film, coating a surface of the metal foil with a photoresist, exposing and developing the photoresist to form a desired pattern of the photoresist, selectively etching the metal foil using the pattern as a masking material to form a wiring pattern composed of the etched metal foil, and then forming a solder resist layer on the wiring pattern except the terminal portions.

In the above-mentioned production of the film carrier tape for mounting electronic part, the solder resist is applied as follows. A screen mask for solder resist coating in which a screen is stretched on a frame and the screen surface is masked except the area to be coated with the solder resist is used. This screen mask is superimposed on the wiring pattern formed on the insulating film, then the solder resist is fed onto the screen mask, and applied by moving a squeegee to squeeze the solder resist down to the prescribed area of the wiring pattern.

By applying the solder resist as described above, the wiring pattern except the connecting terminal portions can be protected.

In the conventional film carrier tapes for mounting electronic part, the density of formation of the bonding pads is not so high, so that, as shown in 50-*a* of FIG. 7, the solder resist layer 50 is often in a simple shape that is mainly made up of straight lines, such as a square or a rectangle. However, with the recent requirements of high integration, the density of formation of the bonding pads 51 has been increased, e.g., as shown in FIG. 5. Therefore, it becomes necessary to form the solder resist layer 50 along the shapes (indicated by auxiliary broken line 60) of the bonding pads 51. For example, the corner portion of the solder resist layer came to be frequently formed obliquely, as shown in 50-*b* of FIG. 7, or the corner portion of the solder resist layer came to be frequently formed in a shape of a circular arc, as shown in 50-*c* of FIG. 7. In such a film carrier tape for mounting electronic part, the bonding pads (connecting terminals) 51 are formed to arrange along the edge 62 of the solder resist layer 50, as shown in FIG. 5. The solder resist layer 50 of such a shape is often formed by moving a squeegee using a screen mask. The direction of the squeegee moved in this case is indicated by an arrow S in FIG. 5 and FIG. 7.

However, when the circular arc-shaped or oblique corner portion of the solder resist layer is formed by slantwise contacting the squeegee with the edge of the screen mask, the excess solder resist on the screen mask comes round to the lower side of the screen mask by the moving of the squeegee. Therefore, the solder resist at the edge portion that is not right-angled or not parallel to the moving direction of the squeegee, e.g., circular arc-shaped edge portion or oblique edge portion, sometimes protrudes from the coating area of the screen mask. That is to say, the applied solder resist comes round to the lower side of the curved portion or the oblique portion of the screen mask, and hence, the solder resist which has come round to the lower side of the screen and protruded to the edge of the masking zone sometimes forms a horn-like protrusion 52 at the edge of the solder resist layer, as shown in FIG. 6. If the horn-like protrusion 52 reaches the bonding pad 51 which must not be coated with the solder resist, a problem of contact failure of the bonding pad 51 occurs.

The present invention overcomes these problems by providing a film carrier tape for mounting electronic part having a low rate of occurrence of solder resist coating failure at the edge of the solder resist coating layer.

The present invention further provides a screen mask for solder resist coating, which is used for forming a solder resist layer on the film carrier tape for mounting electronic part and by the use of which the solder resist hardly comes round to the back surface of the screen even when a squeegee is moved.

SUMMARY OF THE INVENTION

The film carrier tape for mounting electronic part according to the present invention is a film carrier tape for mounting electronic part comprising an insulating film, a wiring pattern formed on a surface of the insulating film, and a solder resist layer formed by moving a squeegee using a screen mask of a prescribed pattern that is formed in such a manner that connecting terminal portions of the wiring pattern should be exposed, wherein:

an edge of the solder resist layer is formed almost in parallel or almost at right angles to the moving direction of the squeegee used in the application of the solder resist.

The screen mask for solder resist coating according to the present invention, which is used for forming the above-mentioned solder resist layer, is a screen mask comprising a frame, a screen stretched on the frame, and a masking zone that is provided on a screen surface except the area to be coated with the solder resist in order to selectively apply the solder resist, wherein:

an edge of the masking zone provided in order to selectively apply the solder resist is formed almost in parallel or almost at right angles to the moving direction of a squeegee used in the application of the solder resist.

In the film carrier tape for mounting electronic part of the present invention, the edge of the solder resist layer is almost parallel or almost right-angled to the moving direction of a squeegee, and no edge portion obliquely intersecting the moving direction of the squeegee is present. By forming the edge of the solder resist layer almost in parallel or almost at right angles to the moving direction of the squeegee as described above, the solder resist pushed by the squeegee is remarkably prevented from coming round to the back surface of the screen. According to the present invention, therefore, the fraction defective due to the coating failure of the solder resist is prominently decreased.

DETAILED DESCRIPTION OF THE INVENTION

The film carrier tape for mounting electronic part of the present invention and the screen mask for solder resist coating that is used for coating the film carrier tape with a solder resist are described in detail hereinafter.

Figure 1:
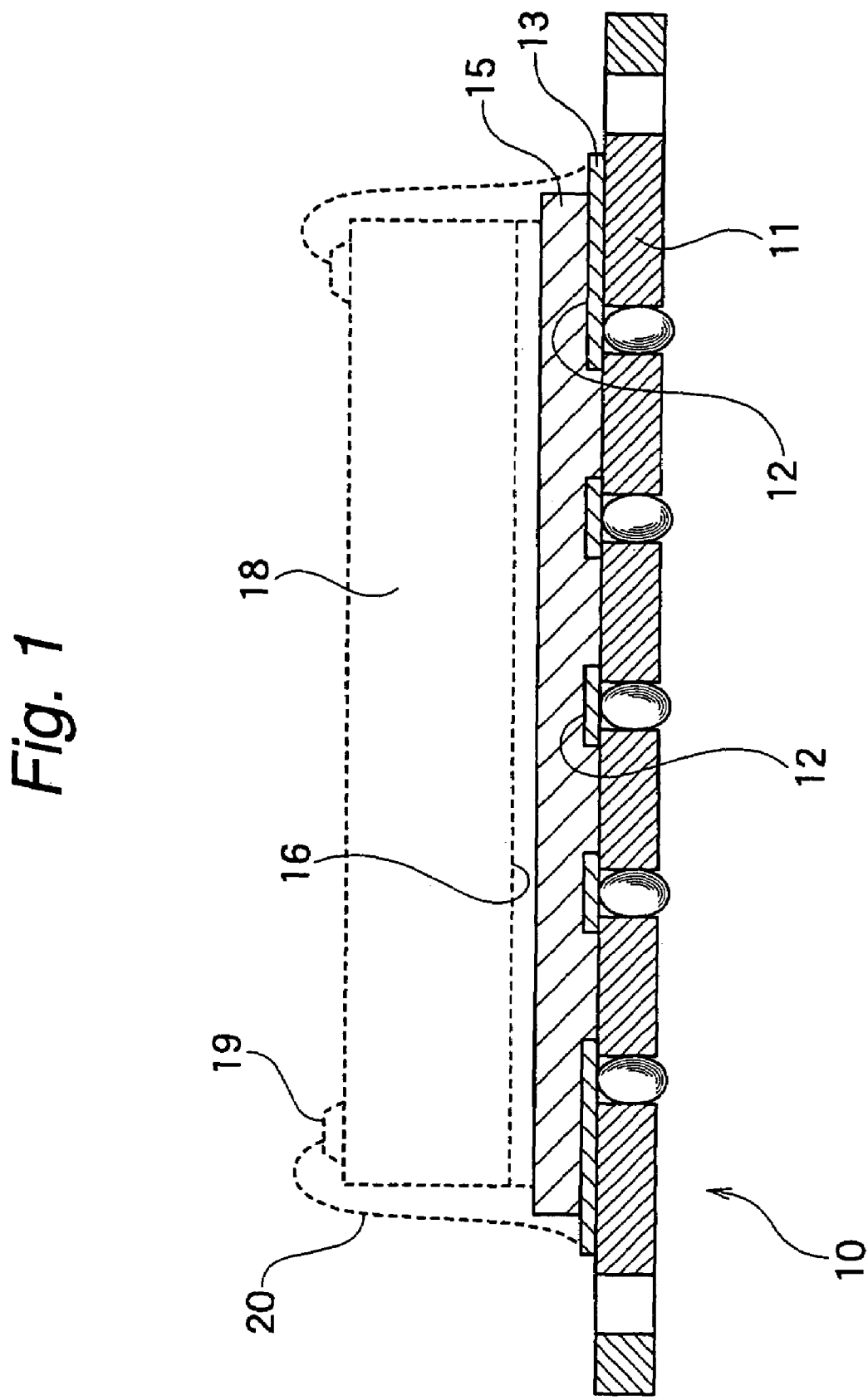
FIG. 1 is a sectional view of an example of a film carrier tape for mounting electronic part of the present invention.

As shown in FIG. 1, the film carrier tape for mounting electronic part 10 of the present invention comprises an insulating film 11 and a wiring pattern 12 formed on a surface of the insulating film 11, and a solder resist layer 15 is formed on the wiring pattern 12 in such a manner that a bonding pad (connecting terminal) 13 of the wiring pattern 12 is exposed. On the solder resist layer 15, an electronic part 18 is mounted through, for example, an adhesive layer 16.

On the electronic part 18, a bump electrode 19 is usually provided, and the bump electrode 19 can be electrically connected to the bonding pad 13 (internal terminal) formed in the film carrier tape for mounting electronic part 10, by means of a gold wire (conductive metal wire) 20.

The insulating film 11 to constitute the film carrier tape for mounting electronic part 10 is a heat-resistant and flexible resin film, and the resin for forming the insulating film is, for example, polyester, polyamide or polyimide. In the present invention, it is preferable to use a film made of polyimide. Examples of the polyimides employable for the insulating film in the present invention include aromatic polyimides generally synthesized from pyromellitic acid dianhydride and aromatic diamines, and aromatic polyimides having biphenyl skeleton synthesized from biphenyltetracarboxylic acid dianhydride and aromatic diamines. In the present invention, any of these polyimides is employable. These polyimides have prominently higher heat resistance and excellent chemical resistance as compared with other resins.

In the present invention, the polyimide film that is preferably used as the insulating film 11 has an average thickness of usually 5 to 150 μm, preferably 5 to 125 μm, particularly preferably 5 to 100 μm.

In the production of the film carrier tape for mounting electronic part of the present invention, various necessary holes, such as sprocket holes, through-type holes for inserting solder balls, device holes, positioning holes and slits for electrically connecting electrodes formed in the electronic parts to leads, can be formed according to the type of the film carrier tape for mounting electronic part to be produced.

On at least one surface of the insulating film 11, a conductive metal layer is formed. The conductive metal layer can be formed by, for example, bonding a conductive metal foil such as an aluminum foil or a copper foil to the insulating film 11 through an adhesive layer, or depositing a small amount of a metal such as nickel or chromium on the surface of the insulating film 11 by means of sputtering or the like and then depositing a metal such as copper on the thus formed metal layer by means of electroless plating, electroplating or the like.

The conductive metal layer formed as above has a thickness of usually 1 to 35 μm.

The wiring pattern 12 can be formed in the following manner. The surface of the conductive metal foil bonded to the surface of the insulating film 11 is coated with a photosensitive resin to form a photosensitive resin layer, and the photosensitive resin layer is exposed in the form of a desired pattern and developed to remove the excess resin. Using the photosensitive resin of a desired pattern as a masking material, the conductive metal foil is selectively etched.

Figure 2:
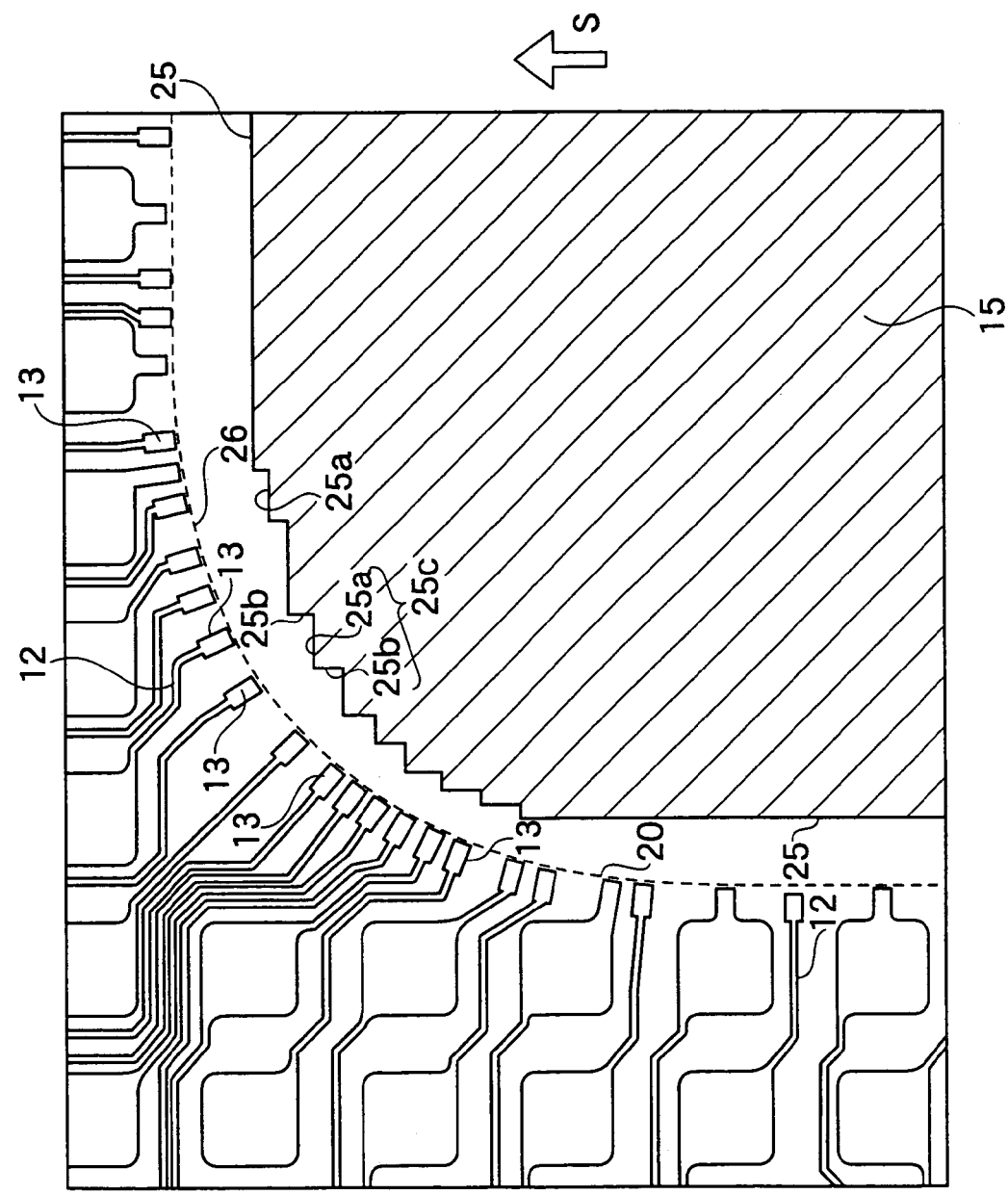
FIG. 2 is an enlarged plan view of a shape of a corner portion of a solder resist layer.

FIG. 2 is an enlarged schematic plan view of a part of the wiring pattern formed as above. Referring to FIG. 2, numeral 12 designates a wiring pattern, numeral 13 designates a bonding pad (connecting terminal), and numeral 15 designates a solder resist layer, which is indicated by oblique lines.

In the film carrier tape for mounting electronic part 10 of the present invention, a large number of bonding pads 13 are formed along a curved (i.e., circular arc-shaped) auxiliary broken line 26. Therefore, it is efficient to form the solder resist layer 15 so as to locate its edge along the auxiliary broken line 26. However, if the solder resist is applied so that the edge of the resulting solder resist layer will be located along the auxiliary broken line 26, the edge of the screen mask and the squeegee obliquely intersect each other, and at the intersection, because of the pressure of the squeegee, the solder resist is liable to come round to the lower surface of the screen mask that is contacted with the squeegee at an acute angle.

Figure 3:
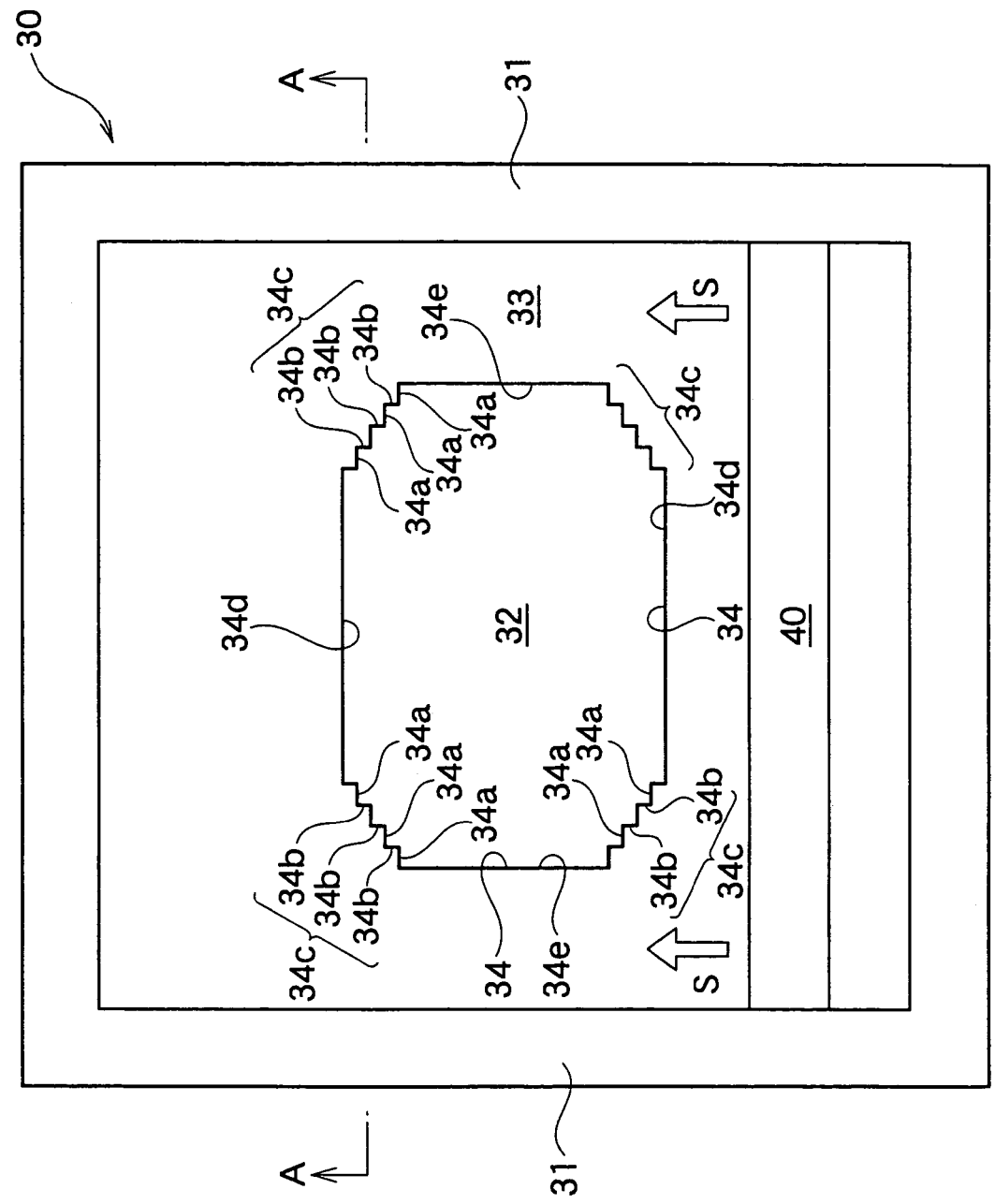
FIG. 3 is a plan view of an example of a screen mask for solder resist coating that is used for forming a solder resist layer.

In the present invention, therefore, a solder resist is applied by the use of a screen mask wherein an edge 34 of a masking zone 33 is formed almost in parallel or almost at right angles to the moving direction S of a squeegee 40, as shown in FIG. 3.

Figure 4:
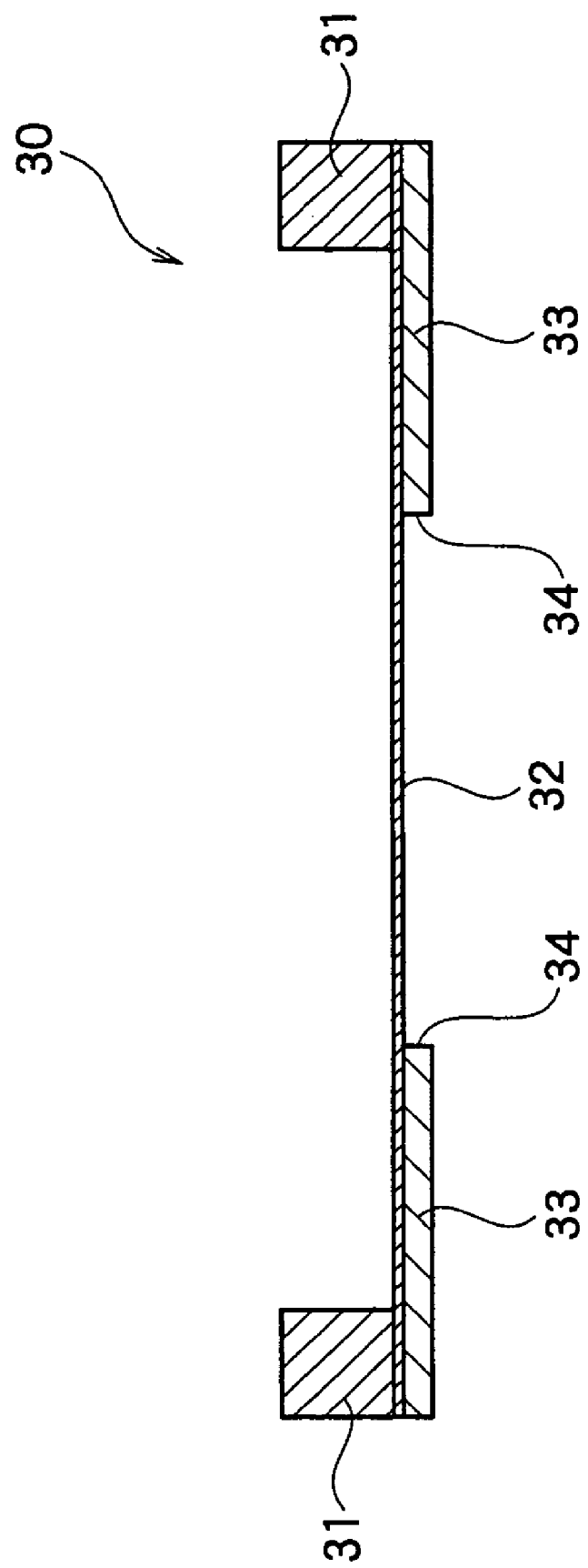
FIG. 4 is a sectional view taken on line A—A in FIG. 3.
Figure 5:
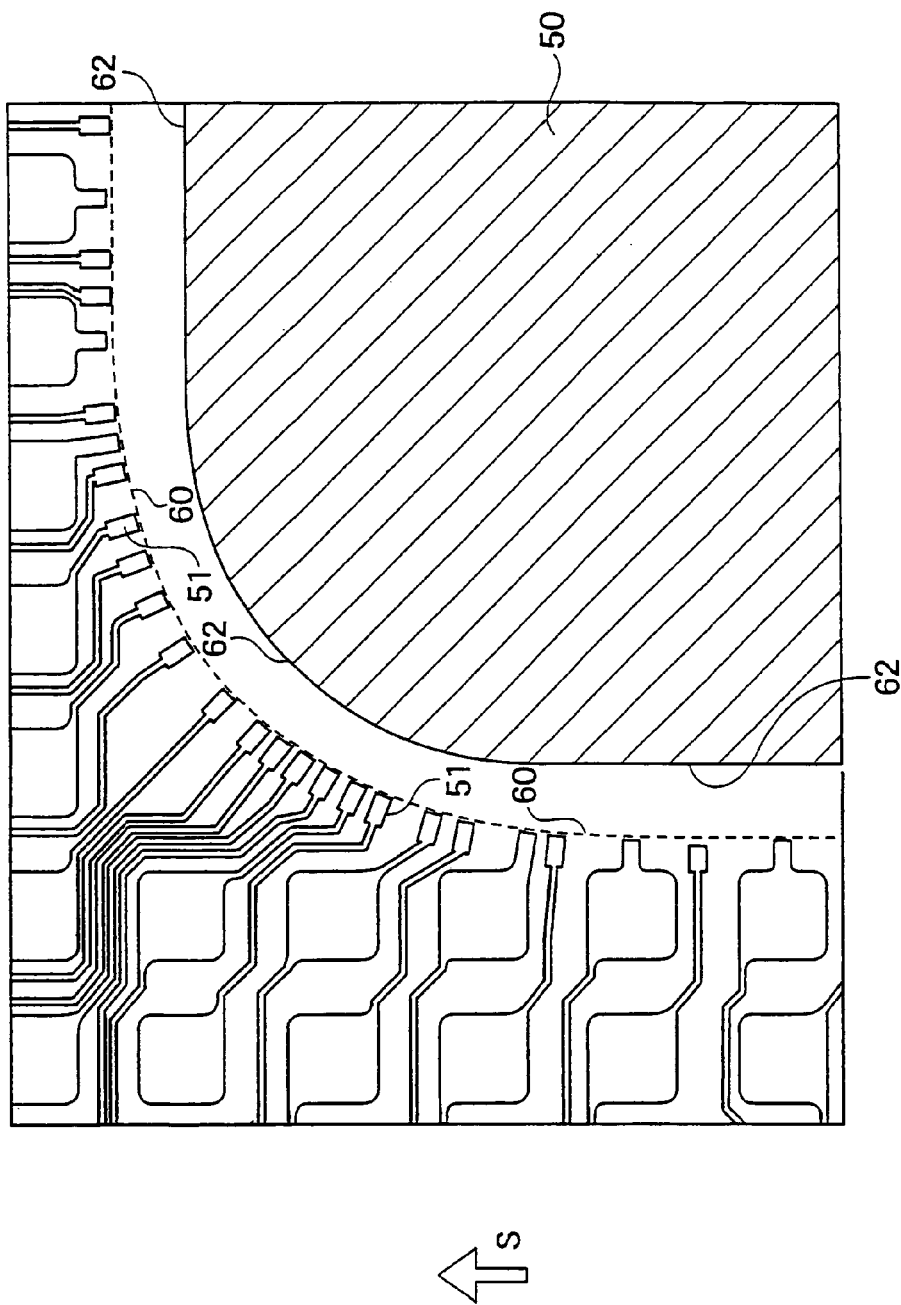
FIG. 5 is an enlarged plan view of a solder resist layer of a conventional film carrier tape for mounting electronic part in which a corner portion of the solder resist layer is in a shape of a circular arc.
Figure 6:
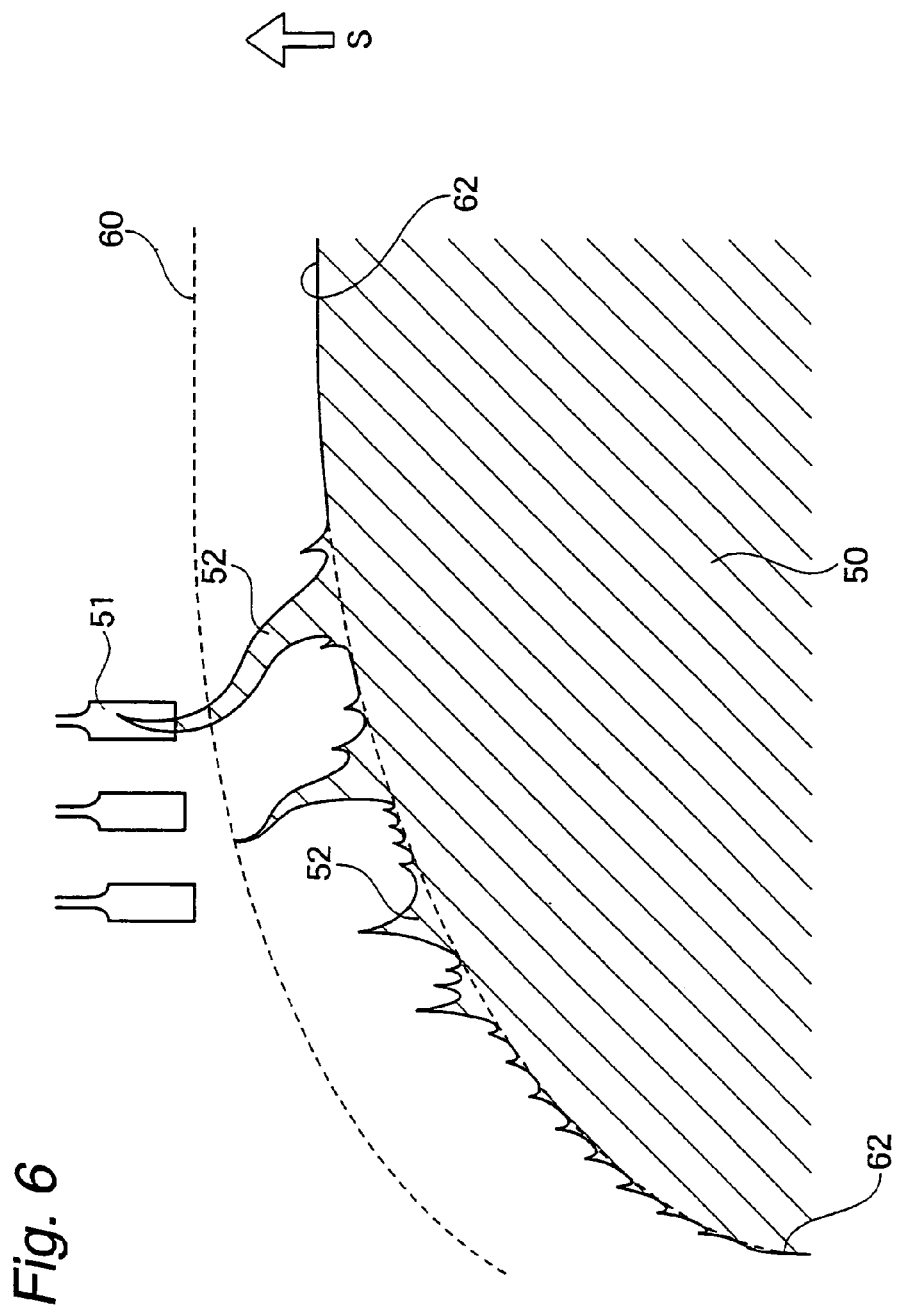
FIG. 6 is an enlarged plan view showing horn-like protrusions occurring in a solder resist layer of a conventional film carrier tape for mounting electronic part.

As shown in FIG. 3 and FIG. 4 that is a sectional view taken on line A—A in FIG. 3, the screen mask 30 for solder resist coating (also referred to as "solder resist coating screen mask 30"), which is used for forming a solder resist layer of the film carrier tape for mounting electronic part of the present invention, has a frame 31, a screen 32 stretched on the frame 31 and a masking zone 33 that is formed on the screen surface except the area to be coated with the solder resist in order to selectively apply the solder resist.

In the solder resist coating screen mask 30, the frame 31 is made of a hard material such as metal or plastic, and on the frame 31, a screen 32 is stretched. The screen 32 has fine meshes, and by the use of a squeegee 40, the solder resist can penetrate the fine meshes of the screen 32 to form a solder resist layer on the surface of the film carrier tape for mounting electronic part. Such a screen can be constituted of a metal wire cloth (metal wire mesh), a silk screen or the like.

The screen 32 is provided with a masking zone 33 so that the solder resist can be applied in a desired shape. The masking zone 33 can be formed by, for example, exposing a photosensitive resin in a desired shape and developing the resin. More specifically, one surface of a plastic film is coated with a photosensitive resin to form a photosensitive resin layer, and the photosensitive resin layer is exposed and then developed to form a desired pattern on the plastic film. The thus formed pattern is transferred onto the screen, whereby a masking zone 33 can be formed on the screen 32. The masking zone 33 may be directly formed on the screen 32 by applying a photosensitive resin onto the screen surface, then exposing the photosensitive layer in a desired shape and developing it.

The edge 34 of the masking zone 33 consists of edge portions 34e, 34e almost parallel to the moving direction S of a squeegee 40, edge portions 34d, 34d almost right-angled to the moving direction S of the squeegee 40, and four corner portions 34c to join the edge portion 34e and the edge portion 34d. In the screen mask 30 of the present invention, the four corner portions 34c are each preferably formed in a shape of a staircase wherein an edge portion 34a almost right-angled to the moving direction S of the squeegee 40 and an edge portion 34b almost parallel to the moving direction S of the squeegee 40 are alternately arranged.

By arranging the edge portion 34a and the edge portion 34b alternately to form the corner portion 34c in a shape of a staircase, the masking zone 33 does not have any edge portion that is obliquely contacted with the squeegee 40, and hence the solder resist pushed up by the moving of the squeegee 40 rarely comes round to the lower surface side of the masking zone 33.

In the present invention, at the staircase-shaped corner portion 34c of the masking zone 33, the edge portion 34a made up of a straight line almost right-angled to the moving direction S of the squeegee 40 and the edge portion 34b made up of a straight line almost parallel to the moving direction S of the squeegee 40 sometimes join to form a fine circular arc at their contact point, but at such a fine circular arc portion formed at their contact point, the solder resist rarely comes round to the lower surface of the screen mask.

In the solder resist layer 15 formed by the use of the above-described solder resist coating screen mask 30, the edge 25 has an edge portion 25c in a shape of a staircase wherein an edge portion 25a almost right-angled to the moving direction S of the squeegee 40 and an edge portion 25b almost parallel to the moving direction S of the squeegee 40 are alternately arranged correspondingly to the edge portion 34a that forms a straight line almost right-angled to the moving direction S of the squeegee 40 and the edge portion 34b that forms a straight line almost parallel to the moving direction S of the squeegee 40. At the edge portion 25c formed in a shape of a staircase, the solder resist rarely comes round to the lower surface of the screen mask, and hence any horn-like protrusion is not formed at the edge portion of a staircase shape. By the formation of the edge portion in a shape of a staircase, the original staircase shape of the edge portion does not change not only in the initial coating stage but also after continuous coating.

The solder resist layer can be formed from, for example, an epoxy resin, a urethane resin or a polyimide resin. The thickness of the solder resist layer formed from such a resin is in the range of usually 5 to 60 μm, preferably 10 to 20 μm.

After the solder resist layer 15 is formed as above, the surface of the wiring pattern 12 exposed from the solder resist layer 15 is subjected to plating.

Examples of the plating methods include nickel plating, nickel/gold plating, gold plating, tin plating and solder plating, and a proper plating method is selected according to the use purpose of the resulting film carrier tape. Although the thickness of the plated layer (not shown) thus formed is not specifically restricted, it is in the range of usually 0.01 to 10 μm, preferably 0.05 to 5 μm.

An embodiment wherein plating is carried out after the solder resist layer is formed is described above, but it is also possible that after a tin plated layer is formed on the wiring pattern, the solder resist layer is formed, and then plating is carried out again. By carrying out plating in plural stages as above, occurrence of whisker or short circuit due to migration can be effectively prevented.

After the plating, heat treatment may be carried out, whereby the metal for forming the plated layer and the metal for forming the wiring pattern can be mutually diffused to give a continuous layer.

As shown in FIG. 1, the film carrier tape for mounting electronic part of the present invention can be used as a film carrier tape for mounting electronic part (e.g., Ball Grid Array (BGA), Chip On Film (COF)) that utilizes a system wherein an electronic part is mounted on a surface of the solder resist layer of the film carrier tape, a bump electrode formed on the electronic part is electrically connected to the bonding pad through, for example, a gold wire, and a solder ball electrically connected to the bonding pad through the wiring pattern is used as an external connecting terminal.

When the external connecting terminal is formed on the back surface of the film carrier tape for mounting electronic part such as BGA, a solder ball is arranged in a solder ball hole formed on the insulating film, whereby the solder ball is electrically connected to the wiring pattern formed on the surface of the insulating film.

It is also possible that a device hole is formed in the film carrier tape for mounting electronic part of the present invention and an electronic part is arranged in the device hole.

There is no specific limitation on the method to mount an electronic part on the film carrier tape for mounting electronic part of the present invention, and any of usual methods is employable.

After the electronic part is mounted as described, the electronic part is sealed with a resin and thereby united to the film carrier tape.

In the film carrier tape for mounting electronic part of the present invention, the edge of the solder resist layer is formed almost in parallel or almost at right angles to the moving direction of the squeegee used in the solder resist coating as described above, and hence, abnormal coating, such as horn-like protrusion of the solder resist from the edge, hardly occurs, and the fraction defective of the film carrier due to the coating failure of the solder resist can be lowered.

The solder resist layer having low fraction defective is formed by the use of a screen mask for solder resist coating in which the edge is formed almost in parallel or almost at right angles to the moving direction of the squeegee used in the solder resist coating, so that the solder resist rarely comes round to the back surface of the screen mask, and hence horn-like protrusion is hardly formed at the edge of the solder resist layer.

Accordingly, the fraction defective of the film carrier tape for mounting electronic part of the present invention due to the coating failure of the solder resist is low.

EXAMPLES

The present invention is further illustrated with reference to the following examples, but it should be construed that the invention is in no way limited to those examples.

Example 1

To a polyimide film having a thickness of 75 μm (trade name: Upilex S, available from Ube industries, Ltd.), an electrodeposited copper foil having an average thickness of 35 μm was bonded with an adhesive layer having a thickness of 12 μm by heating under pressure.

Subsequently, a photosensitive resin was applied onto a surface of the electrodeposited copper foil, then exposed and developed to form a desired pattern composed of a cured photosensitive resin.

The base film having the thus formed pattern was immersed in an etching solution to perform etching of the electrodeposited copper foil using the pattern as a masking material. Thus, a wiring pattern composed of copper was formed.

Separately, a photosensitive resin was applied onto one surface of a polyethylene terephthalate film (PET film) so that the average thickness of the resulting photosensitive resin layer became 2 μm on dry basis. Then, the shape of a masking zone was formed into image data, and on the basis of the image data, the photosensitive resin layer on the PET film was exposed to ultraviolet light and developed in a conventional manner to form a masking zone. In the masking zone thus formed, the corner portion was in a shape of a staircase and had no edge portion obliquely intersecting the moving direction of a squeegee, as shown in FIG. 3.

The masking zone formed on the PET film as described above was transferred to a surface of a screen stretched on a frame to constitute a screen mask for solder resist coating.

Using the screen mask for solder resist coating, an epoxy resin solder resist was applied and then cured to form a solder resist layer having an average thickness of 10 μm.

After the solder resist layer was formed as above, a nickel-plated layer having an average thickness of 0.5 μm was formed on the surface of the wiring pattern (connecting portion) that was extended outward from the solder resist layer, and on this nickel-plated layer, a gold-plated layer having an average thickness of 0.5 μm was further formed.

Thus, 145760 pieces of film carriers were prepared, and they were subjected to visual inspection. As a result, the number of defectives was five (fraction defective: 34 ppm), but any of these five defectives was not attributable to the coating failure of the solder resist.

In the above-mentioned formation of the solder resist layers by applying the solder resist, cleaning of the back surface of the screen was carried out every 200 shots, and the solder resist layer formed at the first shot after the cleaning and the solder resist layer formed at the 200th shot after the cleaning were compared. As a result, with regard to the protrusion of the solder resist, there was no difference between those two solder resist layers.

Comparative Example 1

Figure 7:
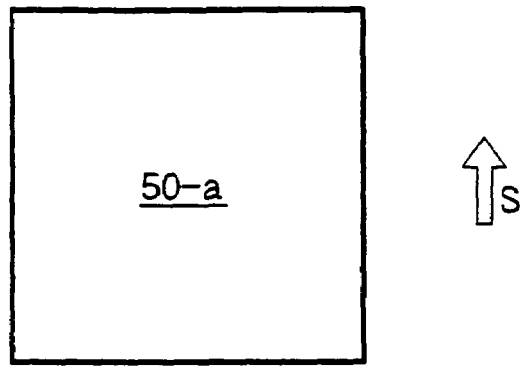
FIG. 7 is a view showing shapes of solder resist layers.
Figure 7:
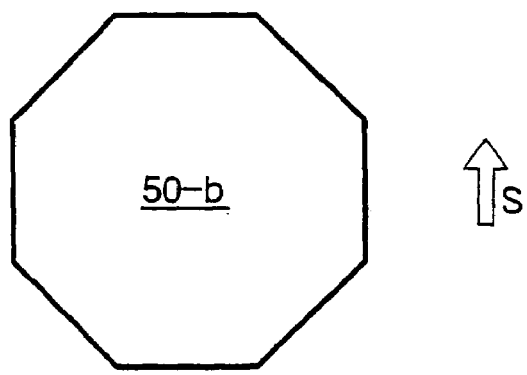
Figure 7:
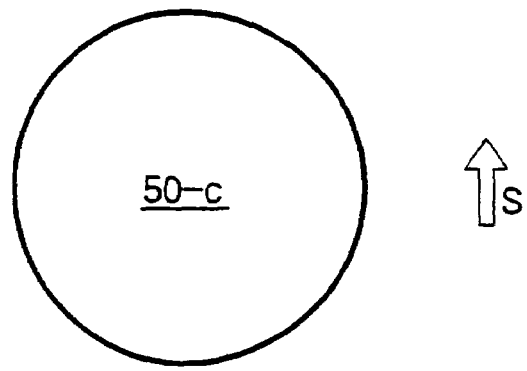

A solder resist layer was formed in the same manner as in Example 1, except that a screen mask wherein the corner portion was formed obliquely to the moving direction of the squeegee as shown in 50-*b* of FIG. 7 was used instead of the screen mask of Example 1 for solder resist coating. Then, 327811 pieces of film carriers were prepared in the same manner as in Example 1.

The film carriers obtained above were subjected to visual inspection in the same manner as in Example 1. As a result, the number of defectives was 1175 (fraction defective: 3584 ppm), and some of these defectives had horn-like protrusions at the edge of the solder resist layer.

In the above-mentioned formation of the solder resist layers by applying the solder resist, cleaning of the back surface of the screen was carried out every 200 shots, and the solder resist layer formed at the first shot after the cleaning and the solder resist layer formed at the 200th shot after the cleaning were compared. As a result, because of protrusion of the solder resist, the edge of the solder resist layer formed at the 200th shot extended outward as compared with the solder resist layer formed at the first shot.

Comparative Example 2

A solder resist layer was formed in the same manner as in Example 1, except that a screen mask wherein the corner portion was formed in a shape of a circular arc to the moving direction of the squeegee as shown in 50-*c* of FIG. 7 was used instead of the screen mask of Example 1 for solder resist coating. Then, 258012 pieces of film carriers were prepared in the same manner as in Example 1.

The film carriers obtained above were subjected to visual inspection in the same manner as in Example 1. As a result, the number of defectives was 1247 (fraction defective: 4833 ppm), and some of these defectives had horn-like protrusions at the edge of the solder resist layer.

In the above-mentioned formation of the solder resist layers by applying the solder resist, cleaning of the back surface of the screen was carried out every 200 shots, and the solder resist layer formed at the first shot after the cleaning and the solder resist layer formed at the 200th shot after the cleaning were compared. As a result, because of protrusion of the solder resist, the edge of the solder resist layer formed at the 200th shot extended outward as compared with the solder resist layer formed at the first shot.

What is claimed is:

1. A film carrier tape for mounting an electronic part comprising an insulating film, a wiring pattern formed on a surface of the insulating film, and a solder resist layer formed by moving a squeegee using a screen mask of a prescribed pattern that is formed in such a manner that connecting terminal portions of the wiring pattern should be exposed, wherein:

an edge of the solder resist layer comprises an edge portion almost parallel to the moving direction of the squeegee, an edge portion almost right-angled to the moving direction of the squeegee and a corner portion that joins the almost parallel edge portion and the almost right-angled edge portion, and the corner portion is in a shape of a staircase wherein the edge portion almost parallel to the moving direction of the squeegee and the edge portion almost right-angled to the moving direction of the squeegee are alternately arranged.

* * * * *